United States Patent [19]

Dolbeare

[11] Patent Number: 4,631,635
[45] Date of Patent: Dec. 23, 1986

[54] VIBRATION ISOLATED COLD PLATE ASSEMBLY

[75] Inventor: Richard T. Dolbeare, Millersville, Md.

[73] Assignee: The United States of America as represented by the Secretary of the Air Force, Washington, D.C.

[21] Appl. No.: 666,786

[22] Filed: Oct. 31, 1984

[51] Int. Cl.⁴ .............................................. H05K 7/20
[52] U.S. Cl. ..................... 361/383; 165/69; 165/80.2; 165/83
[58] Field of Search ............... 361/383, 381, 382, 384; 165/69, 68, 80.2, 83; 357/81, 82; 174/16 HS

[56] References Cited

U.S. PATENT DOCUMENTS

| | | | |
|---|---|---|---|
| 2,912,624 | 11/1959 | Wagner | 361/384 |
| 2,933,655 | 4/1960 | Gradisar et al. | 361/381 |
| 3,087,982 | 4/1963 | Hayes | 165/69 |
| 3,327,776 | 6/1967 | Butt | 165/80.4 |
| 4,196,775 | 4/1980 | Groh | 165/68 |
| 4,237,521 | 12/1980 | Denker | 361/384 |
| 4,549,602 | 10/1985 | Espinoza | 361/383 |

OTHER PUBLICATIONS

Interface Control Drawing, "Mount, Resilient", #691R363 dated May 19, 1981.
YDoig, et al., "Intermodular Cooling," IBM Tech. Disclosure Bulletin, vol. 18, No. 8, 1/1976, p. 2398 361–383.

*Primary Examiner*—A. D. Pellinen
*Assistant Examiner*—Morris Ginsburg
*Attorney, Agent, or Firm*—Jacob N. Erlich; Donald J. Singer

[57] ABSTRACT

A vibration isolated cold plate assembly having a cold plate cover and a base interconnected together by means of a pair of elongated, rectangular-shaped elements made of elastomeric material. The elongated elements form therebetween a channel through which a coolant flows in communication with a plurality of cooling fins which are secured only to the undersurface of the cold plate cover. Electronic components are mounted on the upper surface of the cold plate cover and are held thereon in a vibration isolated environment while simultaneously having any excess heat dissipated therefrom.

9 Claims, 1 Drawing Figure

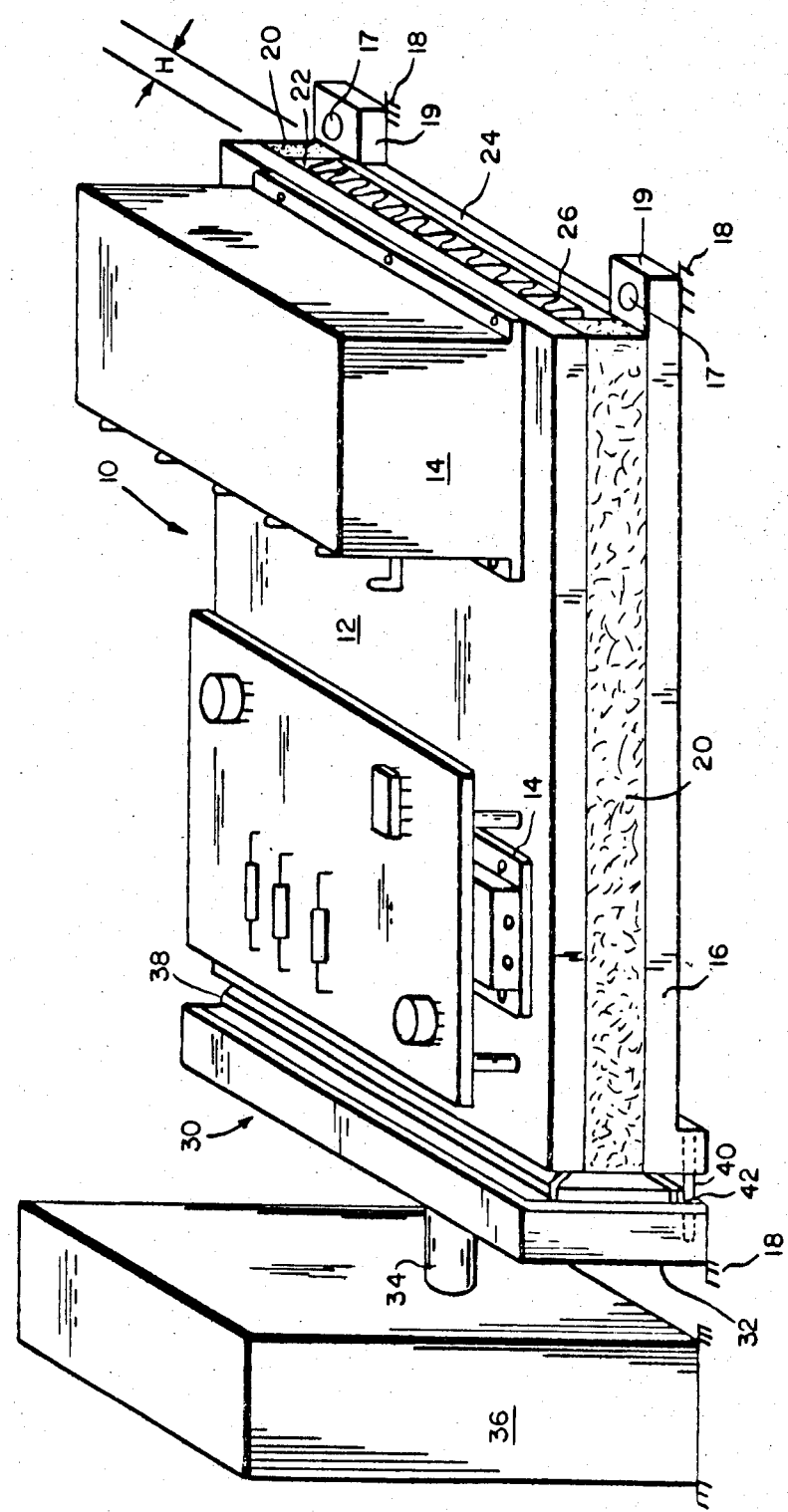

VIBRATION ISOLATED COLD PLATE ASSEMBLY

STATEMENT OF GOVERNMENT INTEREST

The invention described herein may be manufactured and used by or for the Government for governmental purposes without the payment of any royalty thereon.

BACKGROUND OF THE INVENTION

This invention relates generally to a heat dissipating and vibration isolating mounting arrangement, and, more particularly to a vibration isolated cold plate assembly for use in effectively mounting electronic components.

In today's electronic equipment, most of the electric power utilized in operating such equipment is converted into unwanted heat, with only a small portion of that power being converted into useful energy. This results in an undesirable temperature rise in the equipment, the magnitude of which depends upon the amount of heat dissipated by the equipment and/or its mount to the environment. In every day electronic equipment little special design effort is given to providing the required heat transfer capacity since there is normally sufficient space around the various electronic components for adequate cooling to take place.

In certain specialized electronic equipment, however, such as electronic equipment for use within aircraft where space and weight requirements are of prime importance, these electronic components or equipment are generally miniaturized in order to meet these stringent space and weight requirements. This reduction in size of the components results in much greater heat density and the associated problem of transferring the heat from the components. An additional problem, however, also exists when such electronic components are used within high speed aircraft. This problem is the vibration created during aircraft flight which may adversely affect the operation of aircraft electronic components.

Consequently, a great need has arisen in providing a mount capable of not only dissipating excess heat from the electronic components, but also reducing the adverse effects of vibration associated with the utilization of electronic components in such high speed aircraft. Unfortunately, most mounts for electronic equipment are either too bulky or lack the ability to effectively dissipate heat while simultaneously shielding the equipment from excess vibration.

The volume occupied by cold plates and vibration isolating racks, although essential to the overall performance of the electronic components, is non-productive space, in the sense that this volume cannot be used for packaging the functional circuitry. It would therefore be extremely desirable if the vibration isolation function as well as the heat dissipating function could be incorporated into a single unit thereby saving a substantial amount of volume which could be used for additional electronic components. As stated above, heretofore, a reliable, compact vibration isolated cold plate for use with electronic equipment has been lacking.

SUMMARY OF THE INVENTION

The present invention overcomes the problems encountered in the past by providing an effective vibration isolated cold plate assembly which not only efficiently dissipates heat from electronic components but also isolates such components from the vibration encountered in its use within, for example, an aircraft.

The vibration isolated cold plate assembly of the present invention is made of an integral design which has incorporated therein the capability of substantially isolating the electronic components mounted thereon from its surrounding environment as well as the dissipating unwanted heat therefrom. This assembly includes a solid, heat conductive plate, hereinafter referred to as a cold plate cover, made of any suitable, lightweight heat conductive material such as aluminum onto which the electronic components can be easily mounted.

The cold plate cover is spaced apart from a cold plate base plate or base by means of an elastomeric vibration isolator preferably made of a silicone elastomer material. This material has the characteristics of thickness, resiliency, stiffness, etc. tailored to provide the desired vibration isolation characteristics. In addition, this material is configured in the form of two elongated elements so as to provide a longitudinally extending space between the sides thereof. Within this space and attached to the undersurface of the cold plate cover by any suitable method such as bonding or brazing are cooling fins. These fins allow for the effective transfer of heat from the cold plate cover to take place. The cooling fins are not attached to the cold plate base or bottom since this would inhibit the assembly from effectively isolating vibration and preventing vibration from reaching the cold plate cover and the electronic components attached thereto.

Cooling of the electronic components takes place by passing a coolant such as air through the longitudinal space and cooling fins located between the cold plate cover and base of the assembly. Coolant is provided by means of a coolant source such as an air compressor through an air plenum/rear support housing. The housing is operably connected at one end thereof by means of an inlet air pipe to the air compressor and at the other end thereof by means of a thin-wall flex air seal to the cold plate cover and the base of the assembly. In this manner the coolant air can pass directly through the longitudinally extending opening or space and cooling fins without being adversely affected by any vibration associated with the base.

It is therefore an object of this invention to provide an assembly which is capable of mounting electronic components thereon and from preventing any undesirable vibration from reaching the electronic components while simultaneously dissipating any unwanted heat which may emanate from the components.

It is another object of this invention to provide a vibration isolated cold plate assembly which contains a minimum amount of parts so as to allow the utilization of a maximum number of electronic components in a minimal amount of space.

It is still another object of this invention to provide a vibration isolated cold plate assembly which is economical to produce and which utilizes conventional, currently available components that lend themselves to standard mass producing manufacturing techniques.

For a better understanding of the present invention, together with other and further objects thereof, reference is made to the following description taken in conjunction with the accompanying drawing and its scope will be pointed out in the appended claims.

BRIEF DESCRIPTION OF THE DRAWING

The only FIGURE of the drawing is a pictorial representation of the vibration isolated cold plate assembly of the present invention having a series of electronic components mounted thereon.

DETAILED DESCRIPTION OF THE PREFERRED EMBODIMENT

Reference is now made to the only FIGURE of the drawing which pictorially represents all of the elements making up the vibration isolated cold plate assembly 10 of the present invention. Although the present invention finds its major use in providing for the dissipation of heat and the isolation of vibration from electronic components utilized in aircraft, it should be pointed out that the present invention may also be used in any instance in which such vibration free/heat dissipating environment is desired.

The vibration isolated cold plate assembly of this invention includes a rectangular-shaped, solid block of heat conductive material such as aluminum, hereinafter referred to as cold plate cover 12. Fixedly secured to the top surface of cold plate cover 12 are a plurality of electronic components 14. Since the exact makeup of components 14 do not form part of the present invention no further detailed description of these components will be given. However, they are generally in the form of miniaturized electronic components utilized in aircraft operation.

Cold plate cover 12 is spaced apart from a cold plate bottom or base 16 which is generally fixedly secured by any suitable securing means 17 to a surface 18 from which the electronic components 14 are to be vibrationally isolated. For example, base 16 can be secured within an aircraft (not shown) from which the electronic components 14 would be adversely affected by any vibration associated therewith. The base 16 is configured so as to form a flat base structure beneath the cold plate cover 12 and has extending from one end thereof a pair of protrusions 19 which can be utilized to fixedly mount the vibration isolated cold plate assembly 10 in place.

Separating the cold plate cover 12 from base 16 are a pair of elongated, rectangular-shaped isolator elements 20. Elements 20 are preferably in the form of a silicone elastomer material having characteristics of thickness, resiliency, stiffness, etc. tailored to provide the desired vibration isolation characteristics. More specifically, these elements 20 are positioned between cold plate cover 12 and base 16 and are fixedly attached to both cold plate cover 12 and base 16, respectively, in any suitable manner such as bonding or vulcanization. Such a design of the present invention allows for a longitudinally extending space or channel 22 to be formed between the two isolator elements 20, cold plate cover 12 and base 16.

Located within longitudinally extending channel 22 are elongated cooling fins 24. It is essential that cooling fins 24 be fixedly secured only to the undersurface of cold plate cover 12. Generally fins 24 are made of any suitable lightweight, heat conductive material such as an aluminum alloy and are adhered to the undersurface of cold plate cover 12 by any suitable securing means such as bonding or brazing, or any other method which will permit a thermal path to be achieved between the cold plate cover 12 and the fins 24. In addition, it may be desirable to encompass fins 24 with a fin plate or housing 26 in order to maintain coolant in direct contact with the fins if the space or channel 22 between the cold plate cover 12 and base 16 is exceptionally large. This fin plate or housing 26 is unnecessary if the height, H, of channel 22 between the cold plate cover 12 and base 16 is small compared to the height of fins 24.

Coolant, generally in the form of air, is supplied to flow through longitudinally extending channel 22 by means of an air/plenum rear support 30. Plenum/support 30 is in the form of a housing 32 which has associated with one end thereof an inlet air pipe 34 which is connected to any suitable air compressor or air source 36. The other end of housing 32 has associated therewith a thin-wall flex air seal 38. Seal 38 is fixedly secured at one end thereof to housing 32 and non-fixedly secured but in contact with base 16 and cold plate cover 12 at the other end thereof. The thin-wall flex air seal 38 allows for a slight movement to take place between the base 16 and cold plate cover 12 and yet still effectively pass coolant air therethrough and into longitudinally extending channel 22.

Housing 32 is further fixedly secured to surface 18 from which any vibration is to be prevented from reaching the electronic components 14. A pair of rear support pins 40 (only one being shown in the drawing) are affixed at one end of each, respectively, to base 16. The other end of each pin 40 slideably mates within an alignment opening 42 within housing 32 so as to maintain proper alignment between the air plenum/rear support 30 and the other major components of the vibration isolated cold plate assembly 10.

By providing such an assembly 10 as described above, the present invention provides not only for the continual cooling of the electronic components 14 utilized with assembly 10 of the present invention, but also for the isolation of any vibration which may accompany base 16. In this manner the vibration is prevented from reaching the electronic components 14. The assembly 10 of the present invention is extremely compact so that the miniaturization of components 14 does not go to waste.

Although this invention has been described with reference to a particular embodiment, it will be understood that this invention is also capable of further and other embodiments within the spirit and scope of the appended claims.

I claim:

1. A vibration isolated cold plate assembly comprising:
   a base;
   means made of a heat conducting material for supporting thereon at least one electronic component;
   means interposed between said base and said supporting means for substantially preventing any vibration of said base from reaching said supporting means, said vibration preventing means defining an elongated channel between said base and said supporting means;
   means located in said channel and secured only to said supporting means for conducting heat from said supporting means; and
   means interconnected with said channel for supplying a coolant into said channel so as to flow in communication with said heat conducting means and said supporting means, said coolant supplying means including a flexible interconnecting seal directly connected to said base and said supporting means.

2. A vibration isolated cold plate assembly as defined in claim 1 wherein said heat conducting means comprises cooling fins fixedly secured only to said supporting means.

3. A vibration isolated cold plate assembly as defined in claim 2 further comprising means for maintaining alignment between said coolant supplying means and said base.

4. A vibration isolated cold plate assembly as defined in claim 3 further comprising means forming a housing around said cooling fins for receiving said coolant as it flows in communication with said cooling fins.

5. A vibration isolated cold plate assembly as defined in claim 3 wherein said means for preventing vibration comprises a pair of elongated, rectangular-shaped elements made of elastomeric material, each of said elements positioned on opposite sides of said supporting means and said base thereby forming said channel therebetween.

6. A vibration isolated cold plate assembly as defined in claim 5 wherein said interconnecting means of said coolant supplying means comprises a thin-wall flex air seal.

7. A vibration isolated cold plate assembly as defined in claim 6 wherein said means for maintaining alignment between said coolant supplying means and said base comprises at least one pin protruding from said base and into an aligned opening in said coolant supplying means.

8. A vibration isolated cold plate assembly as defined in claim 7 wherein said coolant supplying means further comprises a source of air.

9. A vibration isolated cold plate assembly as defined in claim 8 further comprising means forming a housing around said cooling fins for receiving said coolant as it flows in communication with said cooling fins.

* * * * *